United States Patent
Floyd et al.

(10) Patent No.: US 7,315,212 B2
(45) Date of Patent: Jan. 1, 2008

(54) CIRCUITS AND METHODS FOR IMPLEMENTING TRANSFORMER-COUPLED AMPLIFIERS AT MILLIMETER WAVE FREQUENCIES

(75) Inventors: Brian A. Floyd, Mahopac, NY (US); David Goren, Nesher (IL); Ullrich R. Pfeiffer, Yorktown Heights, NY (US); Scott Kevin Reynolds, Amawalk, NY (US)

(73) Assignee: International Business Machines Corporation, Armonk, NY (US)

( * ) Notice: Subject to any disclaimer, the term of this patent is extended or adjusted under 35 U.S.C. 154(b) by 170 days.

(21) Appl. No.: 11/226,534

(22) Filed: Sep. 13, 2005

(65) Prior Publication Data

US 2006/0232342 A1    Oct. 19, 2006

Related U.S. Application Data

(60) Provisional application No. 60/671,251, filed on Apr. 13, 2005.

(51) Int. Cl.
*H03F 3/04* (2006.01)
(52) U.S. Cl. .................... 330/305; 330/307; 330/165
(58) Field of Classification Search ................ 330/305, 330/307, 165
See application file for complete search history.

(56) References Cited

U.S. PATENT DOCUMENTS

| | | | | |
|---|---|---|---|---|
| 5,396,527 | A * | 3/1995 | Schlecht et al. | 377/57 |
| 6,462,620 | B1 * | 10/2002 | Dupuis et al. | 330/264 |
| 6,784,732 | B2 * | 8/2004 | Hajimiri et al. | 330/251 |
| 6,831,845 | B2 * | 12/2004 | Biebach | 363/16 |

* cited by examiner

*Primary Examiner*—Patricia Nguyen
(74) *Attorney, Agent, or Firm*—F. Chau & Associates, LLC; Frank V. DeRosa

(57) ABSTRACT

Circuits and methods are provided for building integrated transformer-coupled amplifiers with on-chip transformers that are designed to resonate or otherwise tune parasitic capacitances to achieve frequency tuning of amplifiers at millimeter wave operating frequencies.

27 Claims, 4 Drawing Sheets

CIRCUITS AND METHODS FOR IMPLEMENTING TRANSFORMER-COUPLED AMPLIFIERS AT MILLIMETER WAVE FREQUENCIES

CROSS-REFERENCE TO RELATED APPLICATION

This application claims priority to U.S. Provisional application Ser. No. 60/671,251, filed on Apr. 13, 2005, which is fully incorporated herein by reference.

TECHNICAL FIELD

The present invention relates generally to integrated transformer-coupled amplifiers that operate at millimeter wave frequencies and, in particular, to circuits and methods for building integrated transformer-coupled amplifiers with on-chip transformers that are designed to resonate or otherwise tune parasitic capacitances to provide frequency tuning of amplifiers at millimeter wave operating frequencies.

BACKGROUND

The continuing development and widespread implementation of wireless/radio communication systems, such as wireless PAN (personal area network), wireless LAN (local area network), wireless WAN (wide area network), cellular networks, etc., is driving the market demand for high-performance, highly-integrated and low-power, low cost solutions for on-chip radio communication systems that operate at millimeter-wave frequencies. For millimeter wave applications, integrated devices (e.g., integrated transmitter, receiver, transceiver systems) are typically fabricated using GaAs or InP semiconductor technologies, as such technologies can provide the speed and power that is needed for applications such as personal-area networks or automotive radars. It has been demonstrated that silicon germanium (SiGe) process technologies, for example, are well positioned to provide such solutions for highly integrated radio communication circuits.

Transistor amplifiers (such as power amplifiers) are essential components in radio communications systems that are used to amplify signals to desired power levels for delivery to a load. In general, various on-chip impedance matching techniques can be used for tuning integrated transistor amplifiers to achieve high output power and efficient operation for a given class of amplifier. Conventional impedance matching or tuning circuits generally include resonant LC circuits (which are implemented using on-chip capacitors and inductors), and integrated transformers (e.g., coupled-wires). In conventional amplifier designs, monolithic on-chip transformers and on-chip capacitors are typically used to design tuning circuits to achieve a desired bandwidth and efficiency at operating frequencies up to a few tens of GHz.

By way of example, FIG. 1A is a generic schematic illustration of a conventional transformer-coupled power amplifier circuit. The power amplifier (10) comprises a transistor amplifier (11) that drives a load impedance (14) via an impedance matching circuit, which comprises a tuning (shunt) capacitor (12) and transformer (13). The shunt tuning capacitor (12), which is connected in parallel across the input terminals (primary winding) of the transformer (13), is selected to tune the reactive component of the transformer input impedance to a desired value appropriate to provide the required drain/collector impedance for the given class of amplifier.

In FIG. 1A, the transformer (13) is represented by a low-frequency equivalent circuit comprising an ideal transformer (13a) and lumped inductors (13b) and (13c). The ideal transformer (13a) has no impedance by itself (ignoring primary inductance/resistance) and simply reflects the impedance load (14) on the secondary back to the primary. The transformer does, however, have a primary inductance (Lp), which has a direct effect on the low frequency response of the transformer (as explained below). The shunt inductor (13b) represents the transformer mutual inductance (or magnetizing inductance) as seen on the primary side, and has a value of $k^2 L_p$, where k is the coupling factor and Lp is the primary inductance. The series inductor (13c) represents transformer leakage inductance as seen on the primary side and has a value of $(1-k^2) L_p$. The leakage inductance is caused by incomplete magnetic coupling between the primary and secondary windings. The low-frequency equivalent circuit model of FIG. 1A omits the parasitic transformer capacitance (which is connected in parallel across inductor (13b)) since the impedance of such parasitic capacitor becomes sufficiently high at low frequencies to permit ignoring its effect.

As noted above, the primary inductance (Lp) has a direct effect on the low frequency response of the transformer. The low frequency −3 dB cutoff point $f_{pk}$ can be determined as follows: $f_{pk} = Z/(2 \pi L_p \sqrt{1-k^2})$, wherein Z is the primary source impedance (which is the reflected impedance in parallel with the source impedance presented by the transistor T1) and wherein Lp is the primary inductance and k the transformer coupling factor as noted above. The low frequency response of the transformer can be improved by increasing the primary inductance Lp (which means a larger structure (core) and/or more turns on the primary). The high frequency limit of the transformer is affected by the leakage inductance (13c) and the distributed capacitance of the inductor (13b), which together form a second order low pass filter, as well as other factors. As the transformer primary inductance Lp is increased, the low frequency response improves but at the expense of a higher and distributed capacitance, which limits the high frequency response.

For on-chip applications, transformers are typically constructed using coupled wires. For example, a conventional on-chip transformer structure comprises two wires (metallic lines) with the same windings on each side, which is referred to as a 1:1 transformer or simply coupled-wires. In particular, an on-chip transformer may be constructed having a first elongated conductor (primary) and a second elongated conductor (secondary) which that are disposed parallel to each other and on a same layer (coplanar). The conductors are patterned from a metal layer that is formed on the substrate surface, and then encapsulated in a dielectric or insulating layer.

Although on-chip transformers (coupled-wires) can be used in transistor amplifier impedance matching networks as depicted in FIG. 1A, implementation becomes more problematic as the operating frequencies are increased to the millimeter wave range. For example, to operate the transformer in the millimeter-wave frequency range, the primary inductance Lp has to be reduced substantially, which in turn, requires the value of additional tuning capacitor (12) to be extremely small. However, at millimeter-wave frequencies, it is increasingly difficult to place small on-chip capacitors in parallel with the inductors to provide the optimum impedance.

Moreover, tuned circuits that are formed using on-chip transformers and capacitors may not have the bandwidth required for the amplifier. Indeed, narrow bandwidths are typically achieved when tuned circuits are formed using conventional coupled wire transformers (such as described above) because such transformers typically exhibit poor electrical performance e.g., low coupling, k=0.06 and high loss, especially with high frequency applications.

Indeed, for lossy substrates such as silicon, the capacitive coupling between the primary and secondary metal lines and the substrate can result in increased power dissipation. If the metal lines are reduced in width to limit such capacitive coupling, the resistance of the metal line increases (e.g., via skin effect) resulting in increased power dissipation.

Moreover, conventional transformer designs do not have well-defined return paths for closed environment EM conditions, which results in the electrical performance being more sensitive to surrounding metallic components. Accordingly, integrated circuit coplanar transformer devices are typically used at lower frequencies where lower coupling factors, losses due to the skin effect, and inaccuracies caused by model to hardware discrepancies can be tolerated.

SUMMARY OF THE INVENTION

Exemplary embodiments of the invention generally include IC (integrated circuit) transformer-coupled amplifiers that operate at millimeter wave frequencies. More specifically, exemplary embodiments of the invention include circuits and methods for building IC transformer-coupled amplifiers with on-chip transformers that are designed to resonate or otherwise tune parasitic capacitances of the amplifier to provide frequency tuning of amplifiers at millimeter wave operating frequencies (e.g., frequencies of about 30 GHZ or greater).

In one exemplary embodiment, an IC amplfier is tuned for a desired operating frequency by tuning a parasitic capacitance at a node of the IC amplifier using a parasitic inductance of an integrated transformer device connected to the node. More specifically, a tuning circuit is formed using the parasitic capacitance at a given node of the amplfier in conjunction with a parasitic inductance provided by an integrated transformer device connected to the amplfier node. Exemplary tuning methods can be implemented for tuning parasitic capacitances at input, output and/or intermediate nodes of the IC amplifier.

These and other exemplary embodiments, features and advantages of the present invention will be described or become apparent from the following detailed description of exemplary embodiments, which is to be read in connection with the accompanying drawings.

DETAILED DESCRIPTION OF EXEMPLARY EMBODIMENTS

Exemplary embodiments of the invention as described in detail hereafter include circuits and methods for building integrated transformer-coupled amplifiers using on-chip transformers that are designed to resonate or otherwise tune parasitic capacitances to provide frequency tuning of amplifiers at millimeter wave operating frequencies.

Figure 1A:
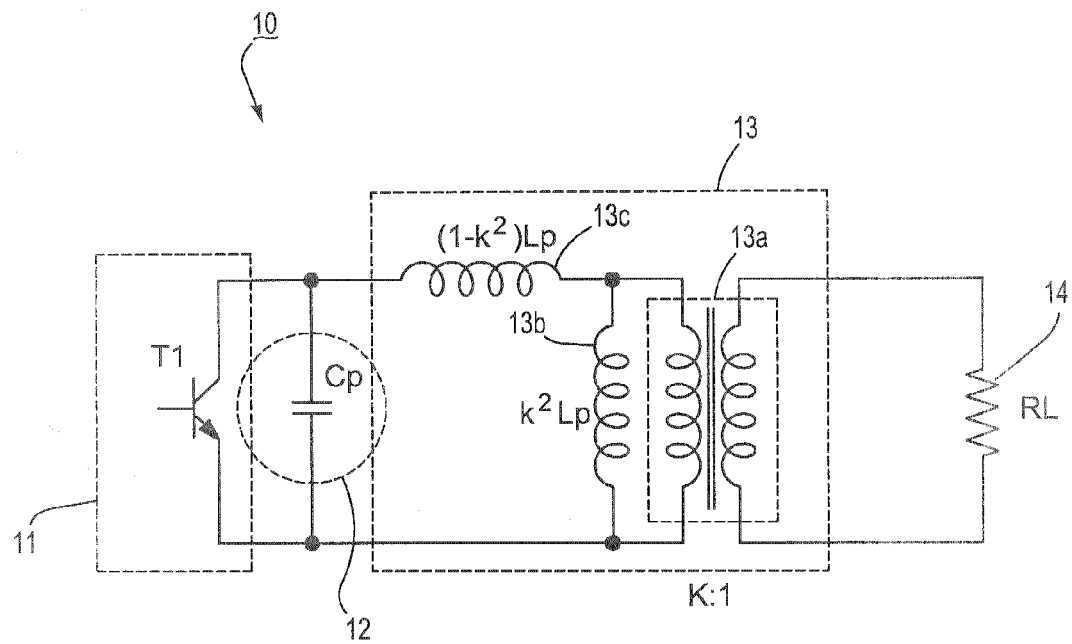
FIG. 1A is a schematic diagram that illustrates a conventional transformer-coupled power amplifier.
Figure 1B:
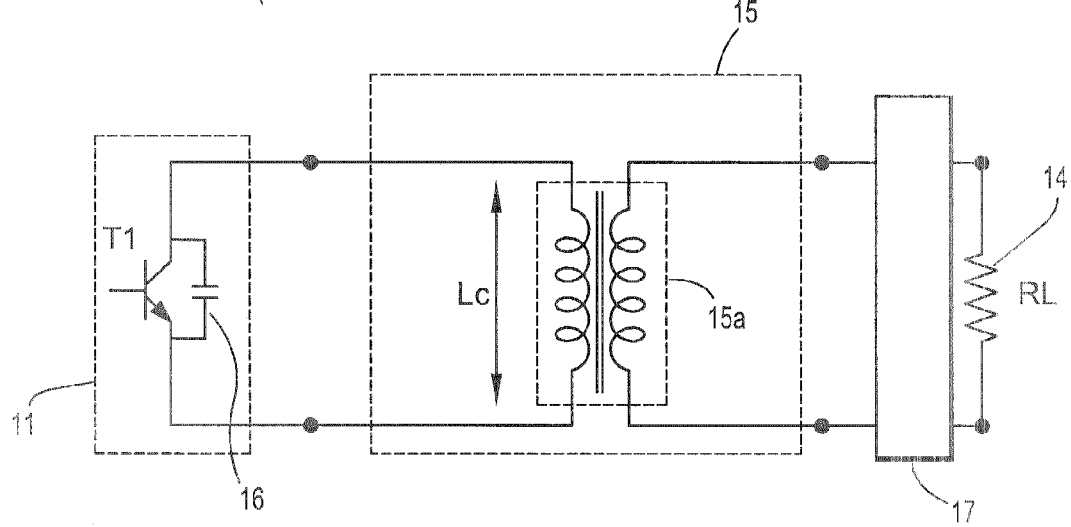
FIG. 1B is a schematic diagram that illustrates a transformer-coupled power amplifier according to an exemplary embodiment of the invention.

For example, FIG. 1B is a generic schematic circuit diagram of a transformer-coupled power amplifier according to an exemplary embodiment of the invention. In particular, FIG. 1B illustrates a method for frequency tuning a transistor amplifier using an integrated transformer that is designed to provide a parasitic inductance for resonating or otherwise tuning a parasitic capacitance of a transistor amplifier T1, according to an exemplary embodiment of the invention.

Referring to FIG. 1B, the power amplifier (10') comprises an amplifier stage (11) (e.g., output stage) that drives a load impedance (14) via an integrated transformer device (15) and impedance matching network (17). In the exemplary embodiment, a tuning circuit is formed using the parasitic capacitance (16) at an output node of the amplfier in conjunction with a parasitic inductance of the transformer (15), wherein the transformer (15) is structured to provide a parasitic inductance that can resonate or otherise appropriately tune the parasitic capacitance (16) at an operating frequency of the amplifier. This is to be contrasted with the conventional method of FIG. 1A, wherein frequency tuning is implemented using an additional shunt tuning capacitor (12) across the primary terminals of the transformer (13).

In accordance with exemplary embodiments of the invention, an IC amplifier can be tuned for a desired operating frequency by tuning a parasitic capacitance at a node of the IC amplifier using a parasitic inductance of an integrated transformer device connected to the node. Although the exemplary embodiment of FIG. 1B illustrates a method for tuning a parasitic capacitance at an output node of the amplifier, it is to be appriciated that depending on the application, exemplary tuning methods can be implemented for tuning parasitic capacitances at input, output and/or intermediate nodes of an amplifier.

In accordance with an exemplary embodiment of the invention as depicted in FIG. 1B, the transformer (15) comprises a 1:1 integrated transformer (15) having a coupled-wire framework with primary and secondary conductors, wherein the conductors are scalable by conductor length, Lc, to provide a desired parasitic inductance for tuning the parasitic capacitance (16) at the output node of the amplifier. The transformer (15) can be designed to provide a parasitic inductance that resonates the parasitic capacitance (16) at the operating frequency. In such instance, a real impedance will exist at the output node of the amplifier.

By way of example, with the exemplary amplifier circuit of FIG. 1B, assuming the transistor T1 has a parasitic capacitance (16) of $167 \times 10^{-15}$ farads and the amplifier operating frequency is 60 GHz, an IC transformer can be designed (based, for example, on the framework of FIGS. 2A and 2B discussed below) having a coupling factor k=0.8, with a conductor length, Lc=80 μm, to provide a primary inductance, Lp=44 pH, to resonate the parasitic capacitance of $167 \times 10^{-15}$ farads at the 60 GHz operating frequency.

The impedance matching network (17) can be used to transform or otherwise match the load impedance (14) to an amplifier impedance which is needed for a given class of operation of the amplifier. In such instance, the transformer (15) can be designed for tuning purposes, such as resonating the parasitic capacitance (16) at the output node of the amplifier, and the matching network (17) can be designed for the purpose of transforming the load impedance (14) to a desired impedance.

In FIG. 1B, the transformer (15) is represented by a transformer MMW equivalent circuit (15a) which, in accordance with an exemplary embodiment of the invention, can be defined using parameterized transformer model that incorporates transformer non-idealities, and which is scalable by length, Lc. As note above, tuning is achieved at millimeter wave frequencies by scaling the length, Lc, parameter, to match to a desired primary inductance value. IC transformers are designed having extremely compact structures having high quality (Q) and coupling (k) factors at millimeter wave frequencies, which allows for efficient and broadband operation and high tuning precision, as well as reduced frequency dependence which allows for more accurate and higher bandwidth modeling for millimeter wave applications.

In one exemplary embodiment of the invention, on-chip transformer devices can be designed and modeled using the methods disclosed in U.S. patent application Ser. No. 11/102,292, filed on Apr. 8, 2005, entitled "INTEGRATED CIRCUIT TRANSFORMER DEVICES FOR ON-CHIP MILLIMETER-WAVE APPLICATIONS", which is commonly assigned and fully incorporated herein by reference. In general, this application discloses on-chip transformer devices having highly efficient compact, stacked coupled-wire frameworks, which provide high-coupling factors (e.g., k=0.8 or better) needed for millimeter waver applications. More specifically, 1:1 integrated circuit transformer structures are described, which can be accurately modeled using 3D/2D compact modeling to build 1:1 parameterized transformer models (e.g. lumped equivalent element models (e.g., RLC network)) that are scalable by conductor length independent of the proximity of other on-chip structures.

Figure 2A:
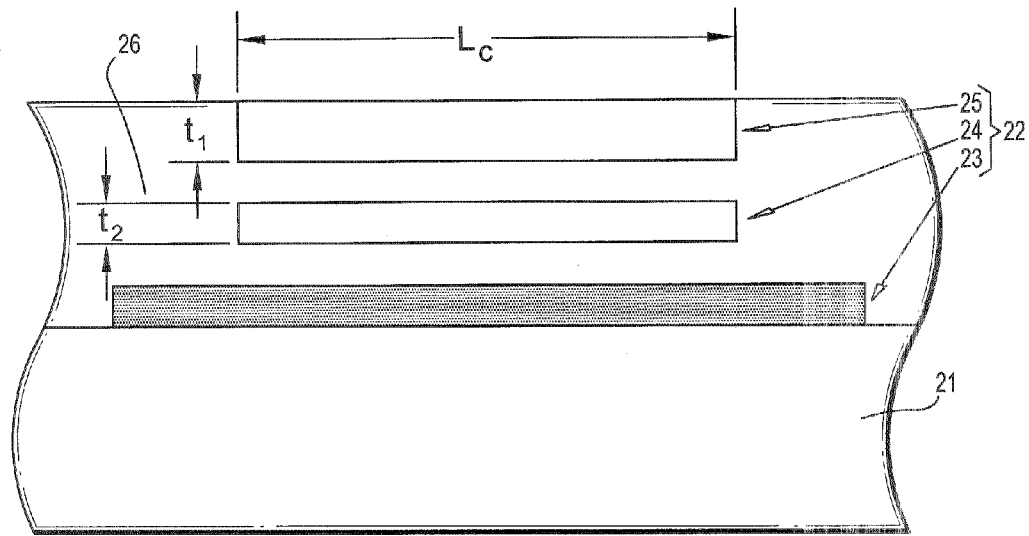
FIGS. 2A and 2B schematically illustrate a compact integrated transformer device which can be used to construct a transformer-coupled amplifier, according to an exemplary embodiment of the invention.
Figure 2B:
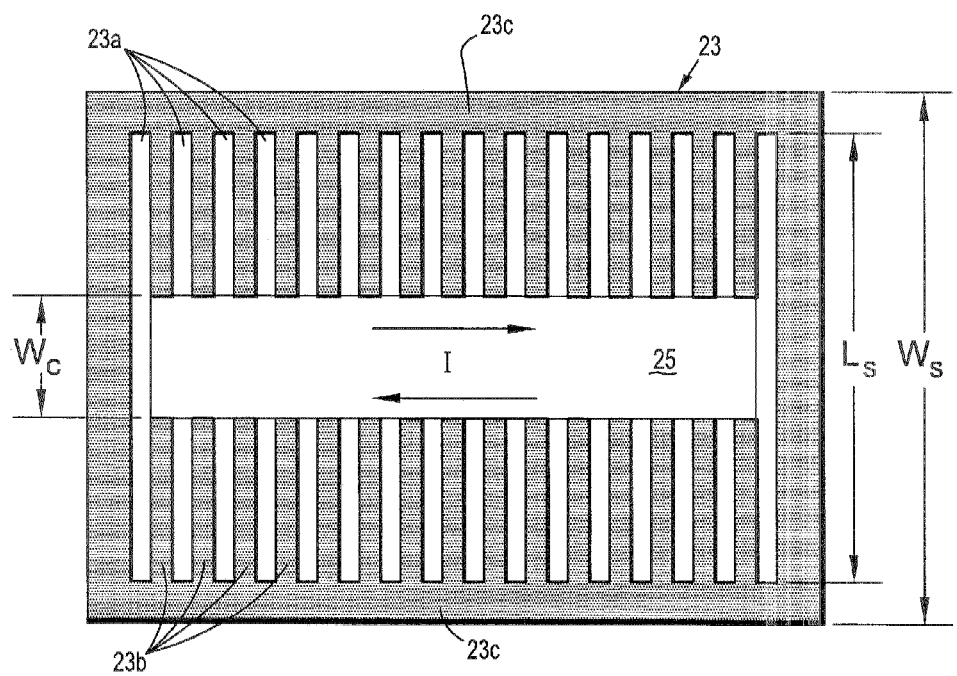

One exemplary embodiment of a compact, on-chip transformer device as disclosed in the above-reference patent application will be described with reference to FIGS. 2A and 2B. In particular, FIGS. 2A and 2B are diagrams that schematically illustrate a compact integrated transformer device according to an exemplary embodiment of the invention, which can be designed for use with a transformer-coupled amplifier to resonate transistor parasitic capacitances and tune the transformer-coupled amplifier to desired impedances for efficient amplifier operation. More specifically, FIG. 2A is a schematic side-view of a semiconductor device (20) comprising a substrate (21) having an integrated transformer device (22) formed thereon, and FIG. 2B is a schematic top plan view of the exemplary device (20) of FIG. 2A. As depicted in FIGS. 2A and 2B, the transformer (22) comprises a ground element (23) (or ground shield), a secondary conductor (24) and a primary conductor (25), which are formed on separate layers of an integrated circuit formed on the substrate (21) to form a stacked transformer structure (22).

The transformer (22) is encapsulated in an insulative/dielectric material (26) (e.g., silicon dioxide or other insulative or dielectric materials), wherein a thin layer of insulative/dielectric material is disposed between the ground element (23) and secondary conductor (24) and between the secondary conductor (24) and the primary conductor (25). The exemplary embodiment depicted in FIGS. 2A and 2B shows the primary and secondary conductors (24) and (25) as being stacked coupled-wires having equal lengths Lc and widths Wc. Moreover, the primary conductor (25) has thickness denoted $t_1$ and the secondary conductor has a thickness denoted $t_2$. Depending on the application, the primary conductor (25) can be formed thicker than the secondary conductor (24) to accommodate higher current densities (DC current).

FIG. 2B further illustrates a pattern for the ground shield element (23) according to an exemplary embodiment of the invention. The exemplary ground shield element (23) comprises a planar metal sheet that is patterned to form a series of parallel close-ended slots (23a) of length Ls. The formation of the close-ended slots (23a) results in the ground shield element (23) having a series of parallel conductive strips (23b) that are commonly connected at end portions thereof along edge regions (23c) (or "side-bar" elements) of the ground shield (23). The close-ended slots (23a) and conductive strips (23b) are disposed in relation to the primary and secondary conductors (24) and (25) such that the slots (23a) and strips (23b) are disposed orthogonal to the directions of wave propagation (as depicted by directional arrows for AC current, I) along the length (longitudinal direction) of the stacked secondary and primary conductors (24) and (25). The exemplary pattern of alternating slots (23a) and strips (23b) extends along the entire lengths Lc of the stacked coupled-wires (24) and (25). Moreover, the side regions (23c) (or side-bar elements) are designed to provide current return paths that extend collinear to the direction of wave propagation lengthwise along the lengths of the stacked conductors (24) and (25).

An integrated transformer device having stacked primary conductor, secondary conductor, and slotted ground shield framework, such as depicted in FIGS. 2A and 2B provides a compact 1:1 integrated circuit transformer structure that is highly efficient and provides high-coupling factors (e.g., k=0.8 or better) for use in millimeter waver applications. Indeed, a stacked coupled-wire framework (as compared to conventional coplanar coupled wire structures) confines the EM fields between the primary and secondary conductors, thereby yielding increased coupling between the primary and secondary conductors and lower losses due to less current crowding effect (less skin effect by width), as well as reduced frequency dependence which allows for higher bandwidth modeling.

Moreover, the slotted ground shield framework, which has a series of densely-spaced conductive strips (23b) and close-ended slots (23a) arranged orthogonal to wave propagation along the primary and secondary conductors, provides effective EM shielding from the substrate (e.g., silicon substrate) which significantly reduces substrate induced losses, and enhances the coupling factor, k, between the primary and secondary conductors. More specifically, the conductive strips (23b) provide means for preventing EM energy from flowing into the substrate (21). Furthermore, the use of close-ended slots (23a) arranged orthogonal to wave propagation along the stacked conductors (24) and (25) provides means for reducing the generation of image currents flowing in the ground shield the direction of wave propagation, thereby decreasing the coupling between the conductors (24) and (25) and the ground shield (23) and effectively enhancing the coupling factor between the primary and secondary conductors (24) and (25).

Furthermore, the edge regions (23c) (or side-bar elements) of the ground shield (23) provide well-defined current return paths (for closed environment EM conditions) that are collinear to wave propagation. In addition, the edge regions (23c) provide means for shielding/isolating the transformer structure from the effects of other components/elements (e.g., vias, amplifiers, wiring, grounds, etc.) surrounding or in proximity to the transformer.

In fact, a slotted ground shield with side-bar elements enables highly compact modeling of the integrated circuit transformer structure to build a lumped equivalent model (e.g., RLC elements), which is scalable by length, Lc. In particular, as described in the above-incorporated patent application, an integrated circuit 1:1 transformer device having a framework as depicted in FIGS. 2A and 2B can be modeled using an RLC filter network (including coupled inductors and dependent sources) for circuit simulation applications. A compact model of the integrated circuit transformer device accurately describe the electrical properties/characteristics of the integrated circuit transformer in all modes of operation and all secondary/primary complex loads, and such properties up to third harmonic of a fundamental millimeter wave frequency. The lumped equivalent model can be used to readily determine network values by simple 2D EM simulations. The lumped equivalent model for an integrated transformed device enables circuit/network analysis of an integrated circuit having one or more of the transformer templates without requiring a full 3D simulation of the integrated circuit.

It is to be appreciated that various semiconductor fabrication methods may be used for constructing an IC transformer device as depicted in FIGS. 2A and 2B. For high-frequency applications, the exemplary IC transformer device can be fabricated based on compound semiconductor technologies such as GaAs (gallium-arsenide) or SiGe (silicon germanium), or other technologies that are suitable for highly integrated circuits operating in millimeter-wave frequency ranges. In one exemplary embodiment, an IC transformer device may be fabricated by forming the primary and secondary conductors and ground shield from different metallization layers that deposited and processed using a BEOL (back-end-of-line) process. More specifically, in one exemplary embodiment, after forming active circuit regions on a substrate, an insulation layer (e.g., silicon dioxide (SiO2)) insulating layer and first metallization layer can be sequentially formed over the active regions. The ground shield (23) can be formed by patterning a portion of the first metallization layer.

Following the first metallization, a second insulation layer and second metal layer are sequentially formed. The portion of the second metal layer that is aligned to the ground shield (23) is patterned to form the secondary conductor (24). Thereafter, a third insulation layer and third metallization layer are sequentially deposited, and the portion of the metal layer aligned to the secondary conductor (24) is patterned to form the primary conductor (25).

In another exemplary embodiment of the invention, the above process can be reversed to form a stacked IC transformer with the ground shield disposed over the secondary and primary conductors. In such embodiments, it is preferable that the metal layer forming the primary conductor is of sufficient thickness to handle increased current densities, for certain applications such as described below.

In one specific exemplary embodiment, the stacked IC transformer can be formed using the current SiGe8HP semiconductor technology of International Business Machines Corporation, wherein the BEOL process includes five layers of metallization formed over the active chip surface. With such technology, the top three layers of metals can be utilized for the primary, second and ground shield elements, and the lower two layers are utilized to form connections between active components and form connections from active components to components of the transformer elements.

Figure 3:
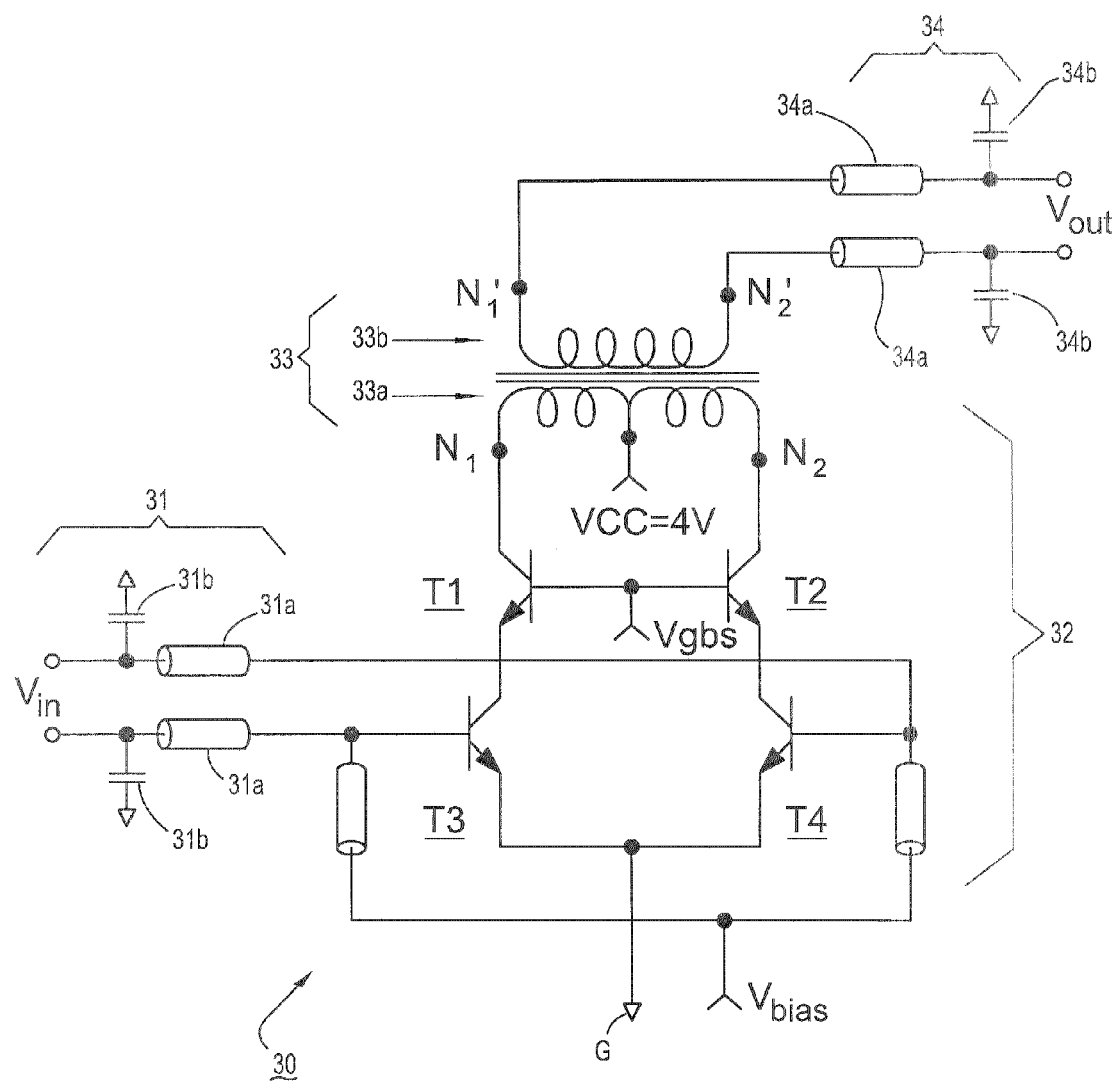
FIG. 3 is a schematic circuit diagram of a push-pull transformer-coupled amplifier according to an exemplary embodiment of the invention.

FIG. 3 is a schematic circuit diagram of a push-pull transformer-coupled amplifier according to an exemplary embodiment of the invention. More specifically, FIG. 3 depicts an exemplary integrated circuit power amplifier (30) for use with MMW applications, which implements an integrated circuit transformer (33) for frequency tuning and high-efficient coupling of output power. In general, the power amplifier (30) comprises an input matching network (31) connected to the differential inputs of a cascode differential amplifier (32), an integrated transformer (33) connected to the differential output nodes of the differential amplifier (32) and an output matching network (34). The input matching circuit (31) matches the differential inputs, $V_{in}$, to a desired characteristic impedance (e.g., 50 Ohms) using series inductive microstrip lines (31a) and parallel capacitors (31b). The output matching circuit (34) matches the differential outputs, $V_{out}$, from a characteristic impedance (50 Ohms) to a desired load impedance using series inductive microstrip lines (34a) and parallel capacitors (34b).

The cascode differential amplifier (32) includes a balanced cascode stage comprising serially connected transistors T1 and T3, and transistors T2 and T4. The transistors T3 and T4 (common-emitter input stages) drive respective transistors T1 and T2 (common-base output stages). A bias Voltage, Vbias, is applied to the base terminals of transistors T3 and T4 and a constant DC voltage, Vgbs, is applied to the base terminals of transistors T1 and T2. These bias voltages are selected to prevent the base to collector voltage across each transistor T1~T4 from exceeding the breakdown voltage of the transistor in the cascode array and to divide the peak voltage applied between the collectors of T1 and T2 and emitters of respective transistors T3 and T4 to prevent breakdown.

In the exemplary embodiment of FIG. 3, the integrated circuit transformer (33) is schematically depicted as having a primary conductor (33a) with input terminals (nodes N1 and N2) and a secondary conductor (33b) with output terminals (nodes N1' and N2'). The collector terminals of transistors T1 and T2 are connected to nodes N1 and N2, respectively. In one exemplary embodiment, the integrated circuit transformer (33) comprises a 1:1 IC transformer having a framework as described in FIGS. 2A and 2B, wherein the primary conductor (33a) and secondary conductor (33b) are stacked over a slotted ground shield. In this embodiment, the collectors of transistors T1 and T2 (output nodes N1, N2) are connected to the length ends of the primary conductor (33a) of the integrated transformer (33), and bias voltage VCC connection is made to a center region between the length ends of the primary conductor (33a).

With the exemplary framework of FIG. 3, the 1:1 IC transformer (33) couples the differential output voltage (VN1-VN2) of the differential amplifier (32) to the secondary conductor (33b) at nodes N1' and N2'. The 1:1 IC transformer (33) can be utilized as a resonator to provide high-efficient coupling of the output power of the amplifier. More specifically, by way of example, the transformer (33) can be designed with a conductor length, Lc, which provides the necessary parasitic inductance to resonate or otherwise tune the parasitic capacitance at the output nodes N1 and N2 of the amplifier (32) at the fundamental operating frequency of the amplifier (32).

Moreover, in the exemplary embodiment of FIG. 3, the input terminal, Vin, are driven differentially with equal amplitude, opposite phase, RF signals, which creates a virtual AC ground on the primary conductor (33a) at the point where the VCC supply connection is made, and at the ground G connection between the sources of the transistors T3 and T4. The virtual AC grounds are points of low loss and low impedance. As such, the virtual AC ground at the VCC connection point eliminates the need for a separate choke inductor and/or a large on-chip bypass capacitor at the VCC supply connection.

Figure 4A:
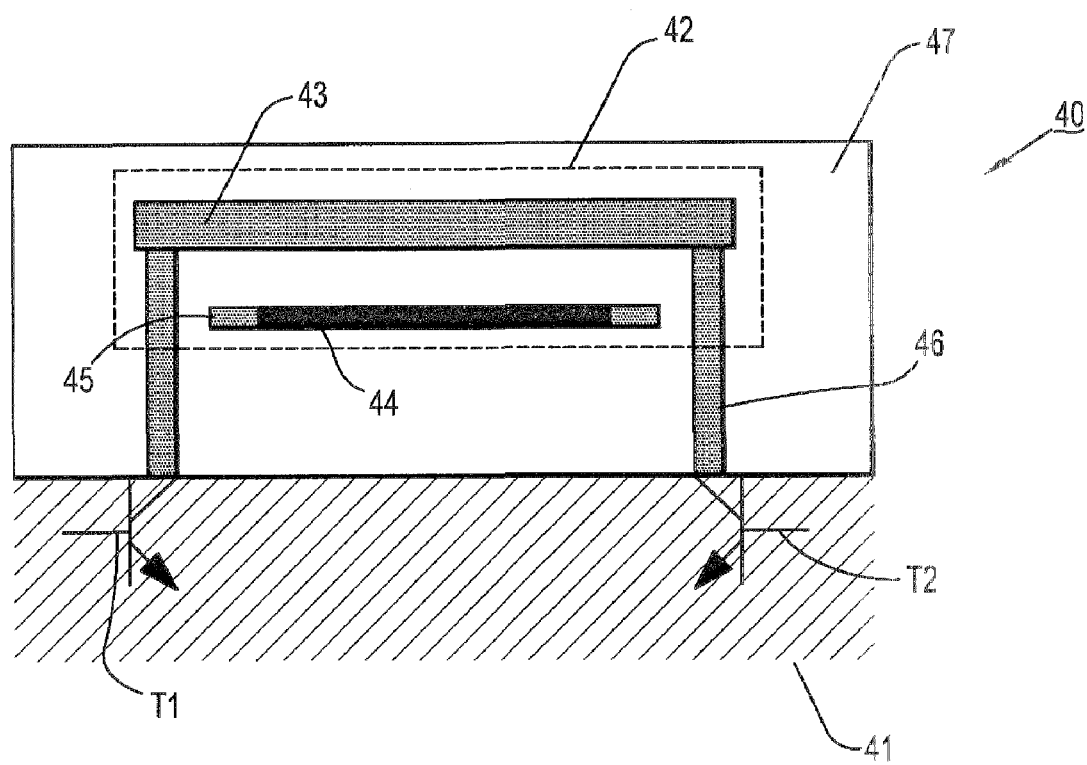
FIGS. 4A and 4B schematically illustrates a semiconductor integrated push-pull transformer-coupled amplifier circuit according to an exemplary embodiment of the invention.
Figure 4B:
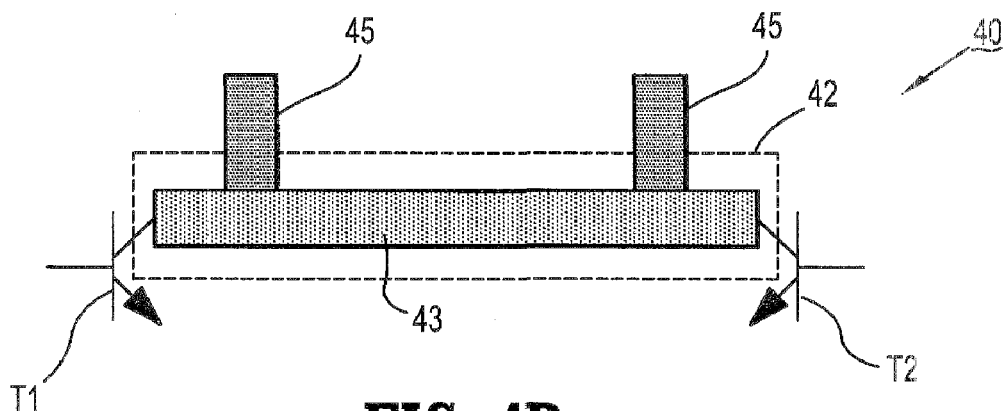

FIGS. 4A and 4B schematically illustrates a semiconductor integrated push-pull transformer-coupled amplifier circuit (40) according to an exemplary embodiment of the invention. In particular, FIG. 4A is a schematic side-view illustration of the integrated push-pull transformer-coupled amplifier circuit (40) and FIG. 4B is a schematic top view illustration of the integrated push-pull transformer-coupled amplifier circuit (40). The circuit (40) comprises a plurality of active components such as transistor amplifiers T1 and T2 formed in a semiconductor substrate (41). The active circuit may be a push-pull transformer-coupled amplifier having a framework as depicted in FIG. 3. An on-chip transformer (42) is a stacked structure having a primary inductor (43) stacked vertically above a secondary inductor (44) and surrounded in dielectric/insulative material (47). Vias (46) are formed through the dielectric layer (47) to connect the transistors (T1) and (T2) of the active circuit to each end portion of the primary inductor (43). The end portions of the secondary inductor (44) include extended tabs (45) that can be directly connected to differential output pads or one end can be grounded if a differential to single-ended conversion is desired. A center tab connection (not shown) on the primary inductor (43) may be included for connecting a DC bias voltage.

As noted above, the conductor length may be scaled to provide the parasitic inductance needed to resonate or otherwise tune the parasitic capacitances at the output nodes of the amplifier and thereby tune the amplifier for a given amplifier class of operation. Again, as depicted in FIG. 1B, no additional tuning capacitor across the primary conductor is needed, thus an extremely compact layout of the amplifier can be achieved.

It is to be further appreciated that an integrated circuit 1:1 transformer device such as depicted in FIGS. 2A and 2B can be readily used as a template (or building block), which is parameterized by length, for constructing various integrated circuit devices and modular structures including, but not limited to, power amplifiers, n:1 impendence transformers, and power combiners. For example, as described in the above incorporated patent application, an integrated power combiner circuit can be implemented using four transformer template devices (FIGS. 2A and 2B) and a plurality of differential push-pull amplifiers (e.g., FIG. 3) which are arranged in a square or circular geometry. A power combiner circuit can be constructed using 4 push-pull amplifiers each with a similarly structured 1:1 transformer (such as depicted in FIG. 3), whose secondary conductors are connected in series. With such exemplary embodiment, an input voltage, Vin, is divided into four equal amplitude, equal phase signals, which are simultaneously applied to different ones of + differential inputs of the amplifiers, and an inverted input voltage, Vin, is divided into four equal amplitude, equal phase signals, which are simultaneously applied to different ones of—differential inputs of the amplifiers, to thereby create an alternating current on each primary conductor. The AC currents on the primary conductors are coupled to the serially connected secondary conductors to generate combined output voltage, Vout.

With this exemplary embodiment, since the primary conductors are independent, the distributed architecture provides a power combiner as well as a 1:n impedance transformer, wherein n denotes the number of push-pull amplifiers. The distributed architecture can be used to provide both frequency tuning and impedance matching for a transformer-coupled amplifier design.

Although illustrative embodiments have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

We claim:

1. A method for frequency tuning an IC (integrated circuit) amplifier, comprising:
    tuning a parasitic capacitance at a node of the IC amplifier using a parasitic inductance of an integrated transformer device connected to the node, at an operating frequency of the IC amplifier, wherein the integrated transformer device comprises a plurality of similarly structured 1:1 coupled-wire transformers with primary and secondary conductors stacked over a slotted ground plane, wherein the secondary conductors are serially connected.

2. The method of claim 1, wherein tuning comprises scaling a length of the primary and secondary conductors of the integrated transformer device to obtain the parasitic inductance desired for tuning the parasitic capacitance at the operating frequency of the IC amplifier.

3. The method of claim 1, wherein tuning comprises tuning a parasitic capacitance at an output node of the IC amplifier.

4. The method of claim 1, wherein tuning comprises tuning a parasitic capacitance at an input node of the IC amplifier.

5. The method of claim 1, wherein tuning comprises tuning a parasitic capacitance at an intermediate node of the IC amplifier.

6. The method of claim 1, wherein the parasitic capacitance includes a parasitic capacitance of a transistor connected to the node.

7. The method of claim 1, wherein tuning the parasitic capacitance comprises resonating the parasitic capacitance at the operating frequency.

8. The method of claim 1, wherein the operating frequency is about 30 GHZ or greater.

9. A frequency tuning circuit for an IC (integrated circuit) amplifier, the tuning circuit comprising:
    a parasitic capacitance at a node of the IC amplifier; and
    a parasitic inductance provided by an integrated transformer device connected to the node,
    wherein the integrated transformer device comprises a plurality of similarly structured 1:1 coupled-wire transformers with primary and secondary conductors stacked over a slotted ground plane, wherein the secondary conductors are serially connected.

10. The frequency tuning circuit of claim 9, wherein the primary and secondary conductors are scalable in length to adjust the parasitic inductance.

11. The frequency tuning circuit of claim 9, wherein the node is an output node of the IC amplifier.

12. The frequency tuning circuit of claim 9, wherein the node is an input node of the IC amplifier.

13. The frequency tuning circuit of claim 9, wherein the node is an intermediate node of the IC amplifier.

14. The frequency tuning circuit of claim 9, wherein the parasitic inductance is selected to resonate the parasitic capacitance at the operating frequency of the IC amplifier.

15. The frequency tuning circuit of claim 9, wherein the parasitic capacitance includes a parasitic capacitance of a transistor connected to the node.

16. The frequency tuning circuit of claim 9, wherein operating frequency is about 30 GHZ or greater.

17. An integrated amplifier circuit, comprising:
an amplifier stage having a node with a parasitic capacitance; and
an integrated transformer device connected to the node of the amplifier stage, wherein the integrated transformer device is structured to provide a parasitic inductance for tuning the parasitic capacitance at an operating frequency of the IC amplifier,
wherein the integrated transformer device comprises a plurality of similarly structured 1:1 coupled-wire transformers with primary and secondary conductors stacked over a slotted ground plane, wherein the secondary conductors are serially connected.

18. The integrated amplifier circuit of claim 17, wherein the amplifier stage is an output stage of the amplifier.

19. The integrated amplifier circuit of claim 17, wherein the amplifier stage in an input stage of the amplifier.

20. The integrated amplifier circuit of claim 17, wherein the amplifier stage in an intermediate stage of the amplifier.

21. The integrated amplifier circuit of claim 17, wherein the primary and secondary conductors are scalable in length to adjust the parasitic inductance of the integrated transformer device.

22. The integrated amplifier circuit of claim 17, wherein the parasitic inductance is selected to resonate the parasitic capacitance at the operating frequency of the IC amplifier.

23. The integrated amplifier circuit of claim 17, wherein the parasitic capacitance includes a parasitic capacitance of a transistor connected to the node.

24. The integrated amplifier circuit of claim 17, wherein the operating frequency is about 30 GHZ or greater.

25. The integrated amplifier circuit of claim 17, wherein the amplifier stage is a differential amplifier stage having differential output terminals, wherein the integrated transformer device comprises a primary conductor connected between the differential output terminals.

26. The integrated amplifier circuit of claim 25, further comprising a supply voltage feed connected to the primary conductor of the integrated transformer device.

27. The integrated amplifier circuit of claim 17, further comprising an impedance matching network connected to an output of the integrated transformer device.

* * * * *